United States Patent
Chen et al.

(10) Patent No.: US 11,775,723 B1
(45) Date of Patent: Oct. 3, 2023

(54) METHODS, SYSTEMS, AND COMPUTER PROGRAM PRODUCTS FOR EFFICIENTLY IMPLEMENTING A 3D-IC

(71) Applicant: Cadence Design Systems, Inc., San Jose, CA (US)

(72) Inventors: Pinhong Chen, Saratoga, CA (US); Liqun Deng, Shanghai (CN); Ximing Zhou, Shanghai (CN); Hanqi Yang, Shanghai (CN); Jieqian Yu, Shanghai (CN); Fangfang Li, Shanghai (CN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/364,388

(22) Filed: Jun. 30, 2021

(51) Int. Cl.
*G06F 30/392* (2020.01)
*G06F 30/31* (2020.01)
*G06F 30/396* (2020.01)

(52) U.S. Cl.
CPC ............ *G06F 30/392* (2020.01); *G06F 30/31* (2020.01); *G06F 30/396* (2020.01)

(58) Field of Classification Search
CPC ....... G06F 30/31; G06F 30/392; G06F 30/396
See application file for complete search history.

(56) References Cited

U.S. PATENT DOCUMENTS

| | | | |
|---|---|---|---|
| 7,526,739 B2 | 4/2009 | Mcilrath | |
| 8,032,857 B2 | 10/2011 | Mcilrath | |
| 8,209,649 B2 | 6/2012 | Mcilrath | |
| 8,266,560 B2 | 9/2012 | Mcilrath | |
| 8,543,952 B2 | 9/2013 | Kariat et al. | |
| 8,650,516 B2 | 2/2014 | Mcilrath | |
| 8,832,608 B1 * | 9/2014 | Chakrabarty | G06F 30/327 716/51 |
| 9,275,185 B2 | 3/2016 | Mcilrath | |
| 9,552,454 B2 | 1/2017 | Chowdhury et al. | |
| 9,640,279 B1 | 5/2017 | Popps et al. | |
| 9,940,260 B1 | 4/2018 | Hughes et al. | |

(Continued)

OTHER PUBLICATIONS

O. Billoint et al., "Merging PDKs to Build a Design Environment for 3D Circuits: Methodology, Challenges and Limitations," 2019 International 3D Systems Integration Conference (3DIC), 2019, pp. 1-5, doi: 10.1109/3DIC48104.2019.9058793. (Year: 2019).*

(Continued)

*Primary Examiner* — Jack Chiang
*Assistant Examiner* — Aric Lin
(74) *Attorney, Agent, or Firm* — Vista IP Law Group, LLP

(57) ABSTRACT

Disclosed is an improved approach for efficiently implementing a three-dimensional integrated circuit (3D-IC) design with heterogeneous and/or homogeneous dies. A first die design and a second die design in a three-dimensional (3D) electronic design maybe identified, and a wrapper design may be generated for at least a block of circuit component designs in the second die design for concurrent implementation of both the first and the second die designs. Both the first and the second dies of the 3D electronic design are concurrently implemented based at least upon a floorplan that is generated with at least the wrapper design for the 3D electronic design. A first wrapper and a second wrapper may be respectively generated for the first die design and the second die design based at least in part upon a result of the concurrent implementation.

20 Claims, 12 Drawing Sheets

(56) References Cited

U.S. PATENT DOCUMENTS

| | | | |
|---|---|---|---|
| 10,825,745 B1 | 11/2020 | Sinha et al. | |
| 11,120,191 B2 | 9/2021 | Xu et al. | |
| 2008/0184184 A1* | 7/2008 | McCracken | G06F 30/39 716/132 |
| 2011/0055791 A1 | 3/2011 | Gao | |
| 2012/0110536 A1 | 5/2012 | Agarwal et al. | |
| 2012/0254818 A1* | 10/2012 | Liu | G06F 30/327 716/135 |
| 2015/0135147 A1 | 5/2015 | Emirian et al. | |
| 2015/0316605 A1* | 11/2015 | Deutsch | G11C 29/56004 702/117 |
| 2020/0257841 A1* | 8/2020 | Sinha | G06F 30/392 |

OTHER PUBLICATIONS

Non-Final Office Action for U.S. Appl. No. 17/219,695 dated Jan. 21, 2022.

Taouil, M., et al., "Exploring Test Opportunities for Memory and Interconnects in 3D Ics," Delft University of Technology, dated 2013.

Von Trapp, F., "Hybrid Bonding: From Concept to Commercialization," InCities, dated Apr. 2, 2018.

Kaibartta, T., et al., "Co-Optimization of Testwrapper Length and TSV for TSV Based 3D SOCs," Journal of Electronic Testing, dated 2020, 36:239-253.

Zhang, H., et al., "Three Dimensional Integrated Circuits," ScienceDirect, dated 2020.

Notice of Allowance for U.S. Appl. No. 17/219,695 dated Apr. 28, 2022.

Non-Final Office Action for U.S. Appl. No. 16/789,296 dated Jul. 12, 2021.

Final Office Action for U.S. Appl. No. 16/789,296 dated Mar. 12, 2021.

Non-Final Office Action for U.S. Appl. No. 16/789,296 dated Nov. 18, 2020.

Notice of Allowance for U.S. Appl. No. 16/789,296 dated Nov. 8, 2021.

* cited by examiner

METHODS, SYSTEMS, AND COMPUTER PROGRAM PRODUCTS FOR EFFICIENTLY IMPLEMENTING A 3D-IC

BACKGROUND

A semiconductor integrated circuit (IC) has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design.

Chip designers often use electronic design automation (EDA) software tools to assist in the design process. Chip design using EDA software tools generally involves an iterative process whereby the chip design is gradually perfected. A top-down design methodology is commonly employed using hardware description languages (HDLs), such as Verilog or VHDL for example, by which the designer creates an integrated circuit by hierarchically defining functional components of the circuit, and then decomposing each component into smaller and smaller components.

The various components of an integrated circuit are initially defined by their functional operations and relevant inputs and outputs. From the HDL or other high-level description, the actual logic cell implementation is typically determined by logic synthesis, which converts the functional description of the circuit into a specific circuit implementation. The logic cells are then "placed" (e.g., given specific coordinate locations in the circuit layout) and "routed" (e.g., wired or connected together according to the designer's circuit definitions). The placement and routing software routines generally accept as their input a flattened netlist that has been generated by the logic synthesis process. Various optimizations may then occur to revise the design to improve aspects such as timing performance of the integrated circuit.

Traditionally, the above-described process is performed individually for a single die in a two-dimensional integrated circuit (2D-IC). However, more recent electronic designs now include three-dimensional integrated circuit designs that include multiple dies in a stacked arrangement. A three-dimensional integrated circuit (3D-IC) refers to integrated circuit device manufactured by stacking multiple dies and connected vertically by TSVs (through silicon vias), bumps, or hybrid-bonding, so that it can achieve higher performance, reduced power and smaller footprint as compared to the conventional two-dimensional integrated circuit.

Although the 3D-IC is a single device from a system point of view, the physical implementation of each die is typically performed separately due to the limitation of mainstream commercial EDA tools. A typical flow of such die-by-die implementation usually starts from the most critical die and with implemented with regards to bumps and TSVs having specific requirement. After one die has its bumps placed and assigned, the bump location information is passed to its neighboring dies. To optimize the bump connection across dies, design iterations are needed to achieve better performance, power and area (PPA) result.

For high performance 3D-ICs whose two neighboring dies have large number of cross-die timing paths, the above-mentioned manual co-design method is far from sufficient to optimize PPAs. This is because when the cross-die timing path is cut into two separate dies, either timing budgeting or modeling is required for each die's optimization to see the delay, transition and the load of the other half of the timing path. In most cases, it is very difficult to make the timing budgeting accurate, as it is essentially a prediction of the path delay before the optimization.

For example, Memory-on-Logic designs implemented as a 3D-IC is one of the challenging applications that is difficult to be implemented with the die-by-die flow. Memory-on-Logic 3D-IC is a type of design having logic cells (registers and combinational logics) and memory hard macros that is characterized by having the memories on one die and the logic cells on the other die. The two dies are stacked as a 3D-IC device, e.g., with hybrid-bonding or equivalent technology connecting them. The implementation challenges not only include the timing budgeting and modeling problem, but also includes the placement of the memory macros, because the placement of the memories need to be optimized according to the placement of the logic cells. In die-by-die flow, each die is implemented separately so they cannot see each other.

Moreover, with the advent of heterogeneous three-dimensional integrated circuit (3D-IC), conventional 3D-IC approaches separately implement each die yet are unable to concurrently implement a 3D-IC design. This separate implementation of each individual die is because the technologies of different dies may be different. For example, one die in a 3D-IC design may adopt 3-nm technology nodes, while another die in the same 3D-IC design may adopt some different technology nodes (e.g., 14-nm or even 22-nm technology nodes). The libraries and various supporting files (e.g., techfiles or technology files from a semiconductor manufacturer or foundry) for different technology nodes may be completely different in such a way that one set of libraries for a technology node of a certain size (e.g., 3-nm) may not be used for other technology nodes of different sizes.

Another reason for the separate implementation of individual dies is that EDA tools (e.g., physical design tools) typically support one floorplan on one plane. A 3D-IC, however, has multiple dies located on different planes so conventional electronic design automation (EDA) tools cannot accommodate all the dies in a single tool session to perform, for example, concurrent physical implementation (e.g., placement, route, etc.), optimization, verification, sign-off, etc. on the entire 3D-IC design.

This separate implementation of individual dies has caused several problems and shortcomings such as inefficiency due to separate implementation of each die individually and independent of other die(s), less-than-optimal design in terms of power, performance, silicon areas, etc. due to the lack of a global view of the entire 3D-IC design (e.g., complete timing path(s) across multiple die designs) and the inability to concurrently optimize the multiple dies in a 3D-IC design on an EDA tool (e.g., in a single EDA tool session), prolonged product design cycles, poor timing budgeting due to lack of the global view of the entire 3D-IC design and hence poor accuracy of timing information, etc.

To further exacerbate this shortcoming of modern EDA tools, some electronic designs (e.g., the aforementioned memory-on-logic 3D-IC, etc.) utilize different technology nodes that are manufactured with corresponding manufacturing processes and thus require respective technology files therefor. For example, a processor may utilize 5-nm or 3-nm technology nodes while the memory cells (e.g., the static RAM (SRAM) for first-level (L1) cache, second-level (L2)

cache, etc.) usually do not require such advanced nodes and may thus utilize 14-nm, 22-nm, etc. technology files.

Problems arise at an EDA tool session when concurrently handling a 3D-IC with such heterogeneous dies having different technology nodes because if the EDA tool session loads the technology file for smaller technology nodes, the design data with larger technology nodes is unable to satisfy the technology file and/or the corresponding design rules or requirements. On the other hand, if the EDA tool session loads the technology file for larger technology nodes, the design data with smaller technology nodes is unable to satisfy the technology file and/or the corresponding design rules or requirements.

The aforementioned shortcomings and problems of conventional approaches are at least partially due to the fact that current state-of-the-art electronic design automation (EDA) tools cannot or at least without extensive modifications and configurations handle multiple die designs with though-silicon vias (TSVs), bumps, hybrid bonding, etc. interconnecting these multiple dies in a single package.

Therefore, what is needed is an improved approach for more efficiently implementing electronic designs corresponding to 3D-IC designs, particularly for 3D-IC designs that are implemented as memory-on-logic designs.

SUMMARY

Embodiments of the present disclosure provide an improved method, system, and computer program products for efficiently implementing a 3D-IC design with heterogeneous and/or homogeneous dies.

Some embodiments are directed to a method for efficiently implementing a three-dimensional integrated circuit (3D-IC) design with heterogeneous and/or homogeneous dies. In these embodiments, a first die design and a second die design in a three-dimensional (3D) electronic design may be identified, and a wrapper design may be generated for at least a block of circuit component designs in the second die design for concurrent implementation of both the first and the second die designs. Both the first and the second dies of the 3D electronic design are concurrently implemented based at least upon a floorplan that is generated with at least the wrapper design for the 3D electronic design. A first wrapper and a second wrapper may be respectively generated for the first die design and the second die design based at least in part upon a result of the concurrent implementation.

In some embodiments that generate the wrapper design, the block of circuit component designs may be identified from the second die design and a pin in the block. A size or boundary of the block of circuit component designs; and a model bump may be created for the pin of the block of circuit component designs.

In some of the immediately preceding embodiments that generate the wrapper design, the block of circuit component designs and the model bump may be modeled as an interface model based at least in part upon the size or boundary of the block of circuit component designs; and the interface model may be inserted into the second die design.

In addition or in the alternative, a determination may be made to decide whether the second die design includes a separate block of circuit component designs in some embodiments. In some of these embodiments where it is determined that the second die design includes the separate block of circuit component designs, a separate model bump may be created for a separate pin of the separate block of circuit component designs; the separate block of circuit component designs and the separate model bump may be modeled as a separate interface model based at least in part upon a separate size or boundary of the separate block of circuit component designs; and the separate interface model may be inserted into the second die design.

In some embodiments that perform the concurrent implementation for both the first and the second dies of the 3D electronic design, one or more blocks of circuit components may be identified in the first die design of the 3D electronic design; one or more interface models may be identified from the second die design of the 3D electronic design; and the floorplan may be generated or updated for the first and the second die designs of the 3D electronic design based at least in part upon identification of the one or more blocks and the one or more interface models.

In some of these embodiments, mixed placement may be performed for the one or more blocks and the one or more interface models in the floorplan of the 3D electronic design; and pre-clock tree synthesis optimization may be performed for the one or more blocks and the one or more interface models in the floorplan of the 3D electronic design.

In some of the immediately preceding embodiments, clock tree synthesis or optimization, routing, post-route optimization, or verification may be performed for the concurrent implementation for the one or more blocks and the one or more interface models in the floorplan of the 3D electronic design.

In some embodiments that generate a first wrapper for the first die design and the second wrapper for the second die design, a standard bump may be created for a separate block of circuit component designs in the first die design of the 3D electronic design; and the standard bump for the separate block of circuit component designs in the first die design may be correlated with the model bump for the block of circuit component designs in the second die design.

In some of these embodiments, the 3D electronic design may be separated into at least a first portion and a second portion. In some of the immediately preceding embodiments, the first wrapper may be created for the first portion of the 3D electronic design using at least the separate block of circuit component designs and the standard bump; and the second wrapper may be created for the second portion of the 3D electronic design using at least the wrapper design and the model bump.

In some embodiments, the 3D electronic design comprises a memory-on-logic electronic design, the interface model comprises an interface logic model, a flexible interface logic model, or an extracted timing model, and the concurrent implementation of the 3D electronic design is performed for both the first and the second die designs using a single electronic design automation (EDA) tool session.

Some embodiments are directed at a hardware system that may be invoked to perform any of the methods, processes, or sub-processes disclosed herein. The hardware system may include at least one microprocessor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

Further details of aspects, objects, and advantages of the present disclosure are described below in the detailed description, drawings, and claims. Both the foregoing general description and the following detailed description are exemplary and explanatory, and are not intended to be limiting as to the scope of the present disclosure.

BRIEF DESCRIPTION OF THE DRAWINGS

The drawings illustrate the design and utility of various embodiments of the present disclosure. It should be noted that the figures are not drawn to scale and that elements of similar structures or functions are represented by like reference numerals throughout the figures. In order to better appreciate how to obtain the above-recited and other advantages and objects of various embodiments of the present disclosure, a more detailed description of the present disclosure briefly described above will be rendered by reference to specific embodiments thereof, which are illustrated in the accompanying drawings. Understanding that these drawings depict only typical embodiments of the present disclosure and are not therefore to be considered limiting of its scope, the present disclosure will be described and explained with additional specificity and detail through the use of the accompanying drawings in which.

DETAILED DESCRIPTION

In some embodiments, an approach is described to implement three-dimensional integrated circuit (3D-IC) electronic designs with heterogeneous and/or homogeneous dies, particularly in some embodiments for memory-on-logic 3D-IC implementations.

Various embodiments implement a 3D-IC to handle concurrent implementation of an 3D-IC having heterogeneous and/or homogeneous dies using various models and pin access abstractions in a 2D EDA tool, which may support one technology node only without modification. The models may include, for example, Interface Logic Model (ILM), flexILM, Extracted Timing Model (ETM in .lib format or in terms of a netlist), a Quick Time Model (QTM), or any other suitable models. A cell, block, or macro modeled as any of these models may be referred to as a cover cell hereinafter and may be used interchangeably throughout the present disclosure, unless and until otherwise specifically distinguished or described.

In some embodiments, the method models every block (e.g., a cell, a macro, etc.) in a die as a model (e.g., a timing model) with pins out on the bump layer. For example, the method may model a macro in the memory die of a 3D-IC design as one of the aforementioned models. A model may have its own timing library, standard parasitic exchange format (SPEF) file which represents RC delay, etc. These models may be used at 3D-IC top level accurate timing/SI closure without heterogeneous technology files loading.

Besides macros, some other embodiments may also be applied to random logic, which comprises a semiconductor circuit design technique that translates high-level logic descriptions directly into hardware features such as AND and/or OR gates, along with timing model generation forming a block. With model generation and modeling of a block as, for example, a cover cell, various embodiments enable mixed, concurrent placement and routing to place and route both circuit blocks and cover cells of a 3D-IC design on a 2D floorplan and optimize the instance locations globally with timing, density, wire length and floorplan constraint.

Figure 1:
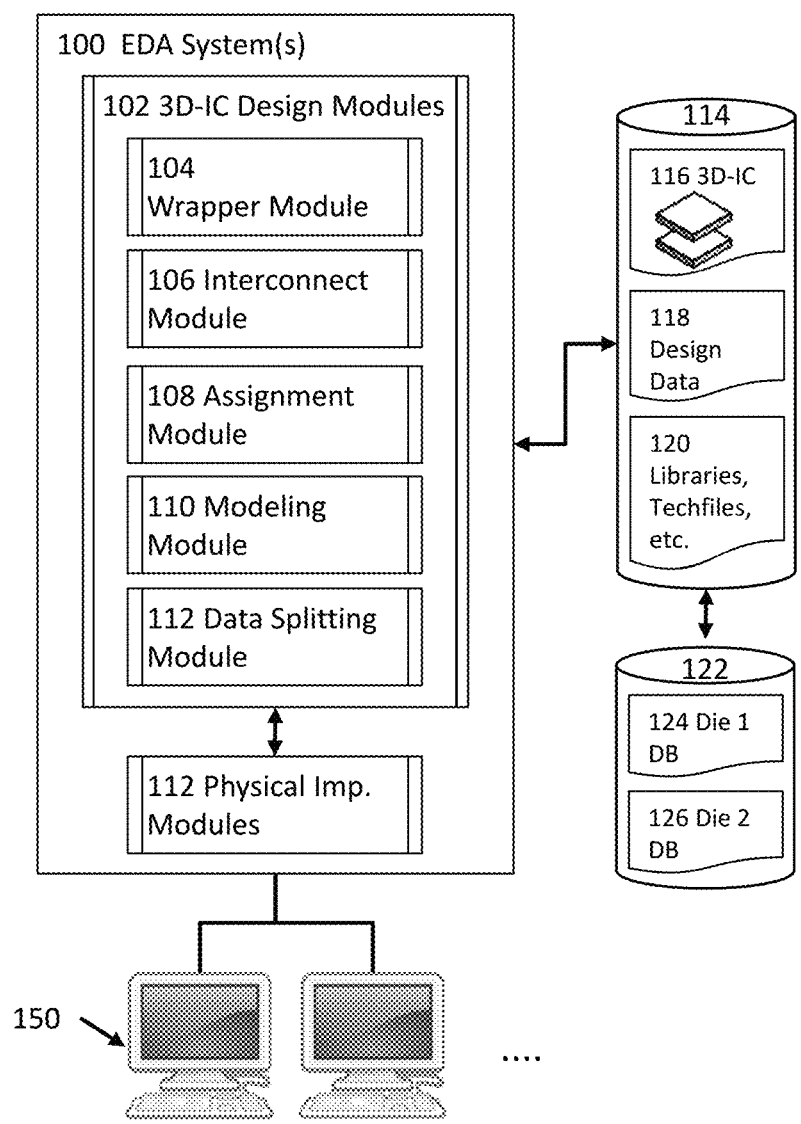
FIG. 1 illustrates a high-level architecture of a system, according to some embodiments, for efficiently implementing a three-dimensional integrated circuit (3D-IC) design with heterogeneous and/or homogeneous dies.
Figure 2:
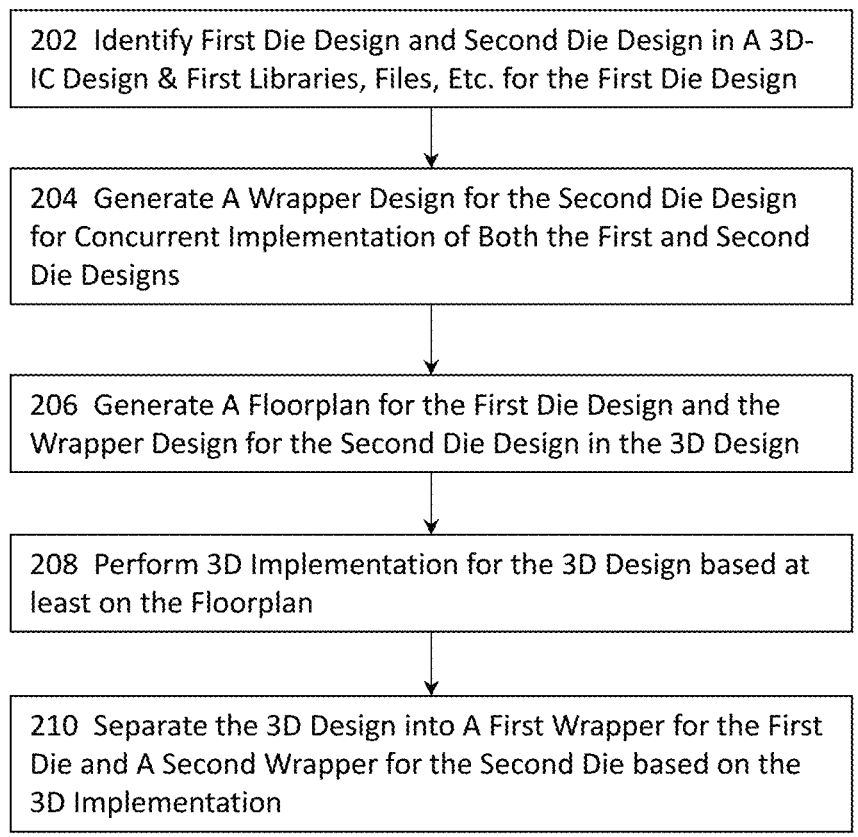
FIG. 2 illustrates a high-level block diagram for efficiently implementing a three-dimensional integrated circuit (3D-IC) design with heterogeneous and/or homogeneous dies, according to some embodiments.

These approaches are illustrated in the high-level block diagrams of FIGS. 1 and 2, the more detailed block diagrams of FIGS. 3A-3D, specific example embodiments of FIGS. 4 and 5A-5D, and an example computing system pertaining to the present disclosure. More particularly, the specific details of actions to implement some embodiments are illustrated in FIG. 2. FIGS. 3A-3D illustrate some example implementations for some actions illustrated in FIG. 2 in some embodiments. FIGS. 4 and 5A-5D illustrates some example 3D-IC implementations in some embodiments. FIG. 6 illustrates an example computing system suitable for implementing some embodiments of the present disclosure.

Various embodiments will now be described in detail with reference to the drawings, which are provided as illustrative examples of the present disclosure so as to enable those skilled in the art to practice the present disclosure. Notably, the figures and the examples below are not meant to limit the scope of the present disclosure. Where certain elements of the present disclosure may be partially or fully implemented using known components (or methods or processes), only those portions of such known components (or methods or processes) that are necessary for an understanding of the present disclosure will be described, and the detailed descriptions of other portions of such known components (or methods or processes) will be omitted so as not to obscure the present disclosure. Further, various embodiments encompass present and future known equivalents to the components referred to herein by way of illustration.

FIG. 1 illustrates a high-level architecture of a system, according to some embodiments, for efficiently implementing a three-dimensional integrated circuit (3D-IC) design with heterogeneous and/or homogeneous dies. In these embodiments, one or more electronic design automation (EDA) systems 100 may support multiple clients 150 with a cloud infrastructure in which an EDA tool may be hosted as, for example, one or more instances, a plurality of services or micro-services, etc. Each of the one or more EDA systems 100 in FIG. 1 may comprise one or more physical computing systems, virtual machines, executable containers, etc. such as a general-purpose computer described in the System Architecture Overview section to implement one or more special proposes.

The illustrative EDA system 100 in FIG. 1 may include an Internet-based computing platform providing a shared pool of configurable computer processing resources (e.g., computer networks, servers, storage, applications, services, a cloud environment, etc.) and data to other computers and devices in a ubiquitous, on-demand basis via the Internet. For example, one or more computing resources and/or modules illustrated in FIG. 1 may be located in a cloud computing platform where computing resources (e.g., storage resources, compute resources, etc.) are provided on an on-demand basis without direct active management by users in some embodiments.

In some embodiments, the computing system 100 in FIG. 1 may comprise one or more physical computing systems or virtual machines 100, such as a general-purpose computer described in the System Architecture Overview section to implement one or more special proposes. The illustrative system in FIG. 1 may include an Internet-based computing platform providing a shared pool of configurable computer processing resources (e.g., computer networks, servers, storage, applications, services, a cloud environment, etc.) and data to other computers and devices in a ubiquitous, on-demand basis via the Internet. For example, an EDA system 100 may include a set of 3D-IC design modules 102 that include one or more computing resources and/or modules illustrated in FIG. 1. These one or more computing resources and/or modules may be located in a cloud computing platform where computing resources (e.g., storage resources, compute resources, etc.) are provided on an on-demand basis without direct active management by users in some embodiments.

Each of these modules illustrated in FIG. 1 may be provided as a monolithic software application in some embodiments or as a set of services or micro-services in other embodiments, or a combination of a monolithic software application and a set of services or micro-services in some other embodiments. In some embodiments, the set of 3D-IC design modules 102 may include, for example, a wrapper module 104 that may be invoked manually and/or programmatically to generate and/or update a wrapper and/or a wrapper design for a block of circuit component designs as described below. The set of 3D-IC design modules 102 may also include, for example, an interconnect module 106 that may be invoked manually and/or programmatically to create interconnects and bumps (e.g., model bumps and/or standard bumps as described below) and to interconnect circuit component designs within a die design or across multiple die designs in a 3D-IC electronic design.

The set of 3D-IC design modules 102 may also include an assignment module 108 that may be invoked manually and/or programmatically to assign interconnects, bumps, etc. to corresponding pins, terminals, ports, etc. of a 3D-IC electronic design. In addition, the set of 3D-IC design modules 102 may include a modeling module 110 that may be invoked manually and/or programmatically to create a model (e.g., a timing model such as an ILM, a flexILM, an ETM, etc.) for a block of circuit component designs as described in greater details below.

Moreover, the set of 3D-IC design modules 102 may include, for example, a data splitting module 112 that may be invoked manually and/or programmatically to split design data of a concurrently implemented 3D-IC electronic design (e.g., via concurrent implementation of the entire 3D-IC electronic design in a single EDA tool session) into individual die designs on which various sign-off tasks (e.g., timing sign-off, power sign-off, etc.) may be performed.

The set of 3D-IC design modules 102 may function alone or in conjunction with a set of physical implementation modules 112 such as a floorplanner, a placement tool, a routing tool, a verification tool, etc. to facilitate the concurrent implementation of an entire 3D-IC electronic design. Each of the set of 3D-IC design modules 102 and/or the set physical implementation modules 112 be invoked as an individual process or as an individual sub-process or a service via, for example, an inter-process call (IPC), an application programming interface (API), etc. from within an EDA tool session.

The EDA system 100 may also access various data or information that may be persistently or temporarily stored in a shared storage 114 such as a distributed storage system. The data or information stored in a shared storage 114 may include, for example, 3D-IC electronic designs or any modified variants thereof 116 (e.g., a 3D-IC electronic design including one or more wrapper designs as described in greater details below) and design data 118 such as schematic design data, physical design data, timing data, etc. In addition, one or more sets of libraries and one or more technology files (techfiles) for one or more technology nodes or one or more types of electronic designs may also be stored in the shared storage 114 to facilitate implementations of 3D-IC electronic designs.

The EDA system 100 may also access one or more databases that may be stored in the same shared storage 114 or in a separate storage 122. For example, the EDA system 100 may store one or more databases for a die design (e.g., 124 or 126), where a database stores the required and/or desired design data that may be used at different stages of the design cycle to facilitate the eventual fabrication of a 3D-IC electronic design.

FIG. 2 illustrates a high-level block diagram for efficiently implementing a three-dimensional integrated circuit (3D-IC) design with heterogeneous and/or homogeneous dies, according to some embodiments. In these embodiments, a first die design having a first semiconductor substrate and first electronic design components and a second die design having a second semiconductor substrate and second electronic design components in a 3D-IC design may be identified 202. A die design identified at 202 may include, for example, a schematic design, a netlist, etc. in some embodiments. In addition, the first die design may utilize various files, models, etc. for design and manufacturing. These various files may include, for example, a first set of libraries (e.g., libraries for standard cells, macros, various models, etc.) and a first set of technology files (or techfiles). These various files, models, etc. may also be identified at 202.

A technology file includes data pertaining to requirements, constraints, guidelines, and any other suitable information or data for design details that are required or desired by a manufacturing facility (e.g., a foundry) in order to manufacture an electronic design having a certain technology node, according to some embodiments. A technology file may be technology node specific in some embodiments. For example, a first techfile for 3-nm technology nodes may have different requirements, constraints, guidelines, etc. from a second techfile for 14-nm technology file. It shall be noted that a technology file is a common term of trade and may include a single file object in some embodiments or more than one file objects from a file system perspective in some other embodiments.

At a stage during an electronic design cycle, a technology file may be loaded into an EDA tool session (e.g., a layout editor session) which may receive the techfile as an input and identify or create corresponding design rules (e.g., whether an interconnect of a first width may or may not be placed immediately adjacent to another interconnect of a second width, spacing values between two immediately neighboring interconnects, etc.) The EDA tool session may monitor the electronic design implementation (e.g., a layout) to determine whether these corresponding design rules are satisfied. As different technology nodes may correspond to different such requirements, constraints, guidelines, etc., electronic designs having different technology nodes may correspond to different, respective techfiles.

Problems arise because a single EDA tool session cannot enforce two different techfiles at the same time in the same single EDA tool session, at least not efficiently doing so. Such problems have thus required legacy approaches to implement different die designs (or even a respective portion thereof) in their respective EDA tool sessions so that each EDA tool session may load the requisite techfile in order to avoid potential conflicting requirements, constraint(s), etc. in these different die designs. Some conventional approaches even require separate EDA tool sessions regardless of whether these multiple die designs use the same technology node (e.g., homogeneous die designs) or different technology nodes (e.g., heterogeneous die designs).

With the first and second die designs of the 3D-IC and the aforementioned files, models, etc. for the first die design identified at 202, a wrapper design may be generated for at least a portion of the second die design at 204 for concurrent implementation of both the first and the second die designs. For example, a designer may load the design data and/or at least a variant of design data of both die designs into a single EDA tool session (e.g., a layout tool session, a post-route optimization tool session, etc.) for concurrent editing, optimization, verification, etc. In some embodiments, a wrapper design may be generated for a block, cell, or instance, etc. at the highest hierarchy of the second die design. For example, a second die design may include 20 instances of various blocks, design components, cells, macros, etc. at the highest hierarchical level. In this example, a corresponding wrapper design may be generated for each such instance for the second die design. The second die design represented by or having such a wrapper design may be referred to as a reconfigured or modified second die design in the present disclosure. More details about 204 will be described below with reference to FIG. 3A.

To concurrently implement multiple die designs in a 3D-IC design, a floorplan may be generated at 206 for the first die design and the wrapper design for the second die design or instances thereof. In some embodiments, a floorplan may be generated at 206 with a floorplanning tool session or a layout editor session. In some of these embodiments, the floorplan comprises more details or more levels of details about the first die design than the second die design because the second die design has been modified with the wrapper design at 204.

Generating a floorplan may start with an initial netlist, where the size of the floorplan may be configured such that in a vertically stacked arrangement of multiple dies (e.g., two stacked dies), the size of the floorplan selected for each die is approximately half of the size of a comparable floorplan if implemented as a 2D design. It is noted that the dies may also corresponds to different die sizes. For example, if a 2D floorplan is created for an example 3D-IC, where the macros, cells, blocks, etc. are all placed onto the same die. If the area and/or density for that same set of circuit component designs is planned for two separate dies, then the floorplanning process would end up with much smaller floorplan sizes for the dies. The floorplan area for the 3D floorplan may be approximately half the floorplan area for the 2D floorplan. While the total area is about the same for both, the size for each die in the 3D design is about half the size of the die in the 2D design.

Implementation of the electronic design may be concurrently performed for both the first die design and the modified second die design at 208. For example, 3D physical implementation such as placement, routing, post-route optimization, and/or verification, etc. may be performed at 208 based at least in part upon the floorplan generated at 206. More details about 208 will be described below with reference to FIG. 3B.

With the 3D implementation done, the 3D-IC design may be separated into a first die wrapper and a second die wrapper at 210 based at least in part upon the 3D implementation concurrently performed at 208. For example, blocks that have been modified or represented as one or more types of models (e.g., an ILM model, a flexILM model, an ETM, etc.) may be separated into one die wrapper from other cells, blocks, etc. that are categorized into a different die wrapper. More details about 210 will be described below with reference to FIG. 3C.

Figure 3A:
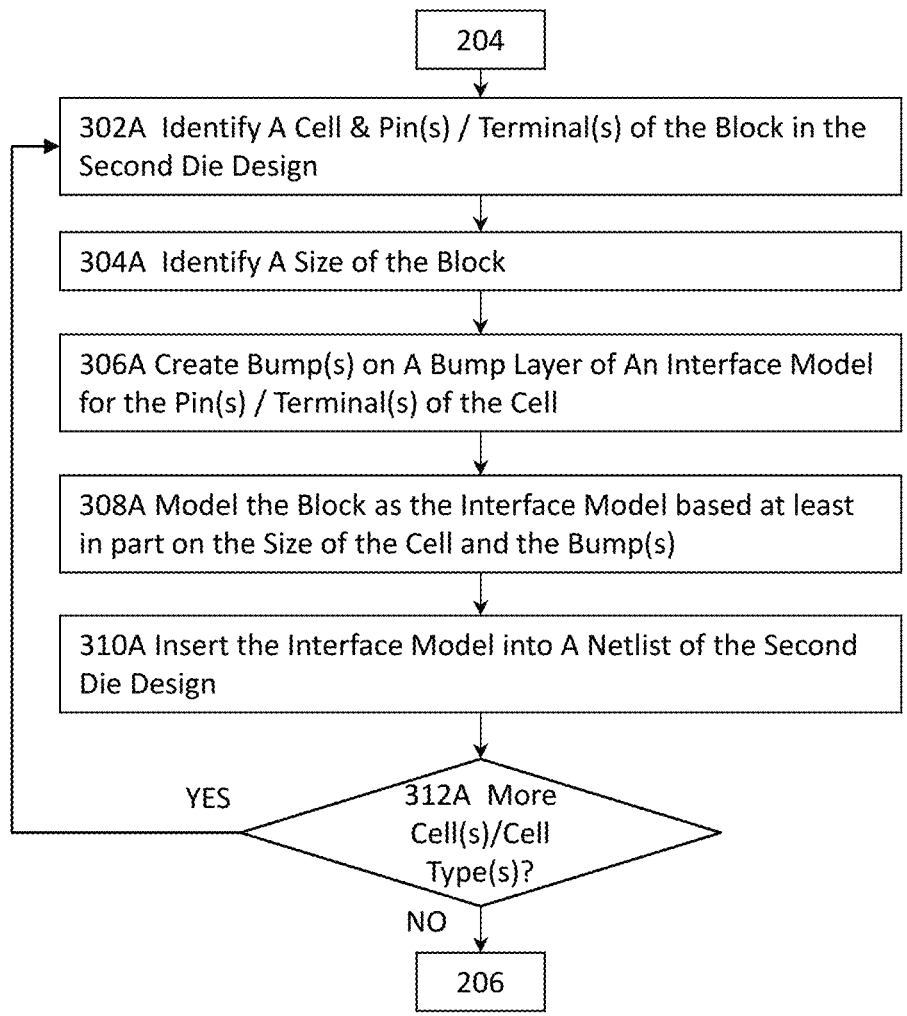
FIG. 3A illustrates more details about a portion of FIG. 2 for efficiently implementing a three-dimensional integrated circuit (3D-IC) design with heterogeneous and/or homogeneous dies, according to some embodiments.

FIG. 3A illustrates more details about a portion of FIG. 2 for efficiently implementing a three-dimensional integrated circuit (3D-IC) design with heterogeneous and/or homogeneous dies, according to some embodiments. More particularly, FIG. 3A illustrates more details about generating a wrapper design for the second die at 204 of FIG. 2.

In these embodiments, a cell, a macro, or a block or group (hereinafter a "block") of circuit component designs of the second die design may be identified for the generation of a wrapper design. A wrapper design comprises a simplified model or representation of the identified block and may include only a smaller subset of circuit component designs but not all the circuit component designs of the identified block. In some embodiments, a wrapper design may be modeled as a cover cell in the sense that the cover cell includes only a smaller subset of design details of the block represented by the cover cell. In some of these embodiments, one or more techfiles loaded into an EDA tool session for concurrent implementation of multiple dies do not apply to a cover cell, or a cover does not include design data that may conflict with the aforementioned one or more techfiles. One of the objectives of a wrapper design for a block is to alleviate, relax, or set aside the requirements of or reliance on a specific techfile for the physical implementation of the block.

In these embodiments, one or more pins, terminals, and/or circuit component designs along or near the interface of the identified block may be identified at 302A for the wrapper design of the identified block where the interface is located at the boundary of the identified block to interconnect the identified block with external circuit component designs of the 3D-IC. In some of these embodiments, any other circuit component designs not along or in the vicinity (e.g., from the input(s) to the first stage of circuit components, such as flip-flops within a block, from the last stage of circuit components to the output(s), etc.) of the interface are not identified at 302A and will not be represented in the wrapper design. For example, any pins, terminals, ports, etc. along the interface and in communication with external circuit components outside the identified may be identified at 302A. In some embodiments, one or more circuit components connected to the identified pins, terminals, ports, etc. and located within the identified block may also be identified at 302A based at least in part upon one or more criteria. One of such one or more criteria may include, for example, whether the implementation of the circuit component design requires data or information in a techfile that is different from that for the first die design for which no wrapper designs are generated.

In addition to the identification of circuit component designs along or near the interface or boundary of the identified block at 302A, the size of the block may also be identified at 304A. In some embodiments, a wrapper design may be generated based at least in part upon the size of the identified block. For example, a wrapper design may be generated to have the same size or footprint as the block so that during physical implementation, the wrapper design occupies the same size or footprint as the block in some embodiments. In some other embodiments, a wrapper design may occupy a larger footprint than the identified block. For example, the boundary of an identified block may be expanded for a wrapper design with uniform or non-uniform margins to accommodate one or more design requirements such as spacing rule(s), etc. in some embodiments.

One or more bumps may be created for the wrapper design at 306A to represent the one or more pins, terminals, ports, etc. identified at 302A. In some embodiments, a bump may be created for each pin, terminal, port, etc. identified at 302A for the identified block. These one or more bumps may be created and stored in a layer such as the top layer of the wrapper design in some embodiments or a separate bump layer in some other embodiments. The one or more pins, terminals, ports, etc. may be respectively assigned to the one or more bumps so that each pin, terminal, port, etc. is connected or routed to a bump created at 306A.

The wrapper design for the identified block of the second die design may be modeled at 308A as a timing model or an interface model (e.g., an Interface Logic Model (ILM), a flexILM, an Extracted Timing Model or ETM, or any other suitable model. This timing or interface model includes at least some data or information that may be referenced for analysis or closure tasks for timing, power, etc. in some embodiments.

An interface logic model or ILM models one or more blocks of circuit component designs as a gate-level model that comprises the connections from the input(s) to the first stage of circuit components (e.g., flip-flops, etc.) as well as the connections from the last stage of the circuit component designs within a block to the output(s) in some embodiments. In some of these embodiments, an ILM may further include the clock tree that drives the aforementioned circuit component designs. In addition, other circuit component designs may not be represented in an ILM so that the entire path may be visible at the top level for interface nets.

An ILM is in sharp contrast with conventional block modeling based on hierarchical implementation flow(s) and provides better accuracy in analysis for interface circuit components (e.g., nets or net segments) at reduced or negligible memory and runtime overhead. Implementation with an ILM is also superior than some conventional approaches that simply models a cell or macro as a single block with only interface pins, terminals, etc. because an ILM provides superior accuracy and/or resolution for the underlying electronic design because of the inclusion of some (but not all) internal circuit component designs in a block.

In some embodiments, an ILM may be read-only and may thus be more suitable for blocks whose designs are more stable, more optimized, and/or less likely to raise issues or errors (e.g., timing issues or violations) or require modifications. Other potential models that may be used include, for example, a flexILM (flexible Interface Logic Model), an ETM, etc. that provide some flexibility in, for example, fixing issues such as timing issues and may thus be used to represent blocks of circuit component designs that may cause issues or errors.

An ETM (extracted timing model) is often used to expedite analyses such as timing analysis, timing and/or power closure tasks, etc. In some embodiments, an ETM may be programmatically generated (e.g., with one or more clicks of a few commands to generate an ETM yet without any additional human intervention) by abstracting away some design details from a block of circuit component designs in such a way that the block is replaced by an ETM model where the design constraints for the underlying electronic design (e.g., a 3D-IC design) match or are verified to match those of the original block. In some embodiments, the contents of a block represented in an ETM may be hidden or suppressed from users and/or EDA tools, and the original netlist may be replaced by a model having the timing arcs for block interfaces with the lookup tables (e.g., non-linear delay model or NDLM lookup tables) extracted for each timing arc. Because the delay of a timing arc may be represented as a function of input transition and output load, an ETM may thus be used with different input transition times and different output loads. In some embodiments, an ETM includes abstracted timing information without any netlist information. In these embodiments, the contents of an ETM may be protected.

It shall be noted that any such models may be used to represent a block of circuit component designs in a die design although some embodiments may use a certain model for some blocks and one or more different models for some other blocks. In some embodiments, an ILM (or flexILM) may be used in, for example, cell-based reusable IP (intellectual property) and/or physical design flows, while an ILM may be used in, for example, hierarchical static timing analysis, sign-off, etc., and a QTM may be used in a top-down design flow, according to some embodiments.

A model described herein models the full input and/or output characteristics (e.g., timing characteristics) of a block without requiring a complete netlist of the block in some embodiments. In some of these embodiments, a model described herein does not model every path in the block represented or replaced by the model. For example, internal register-to-register paths may be generally discarded as these paths are generally analyzed at the block level with the complete gate-level netlist. A model described herein may also support multi-modes for multi-mode analyses, according to some embodiments. A model may support a single PVT (process, voltage, and temperature) corner in some embodiments. In these embodiments, multiple models may be respectively generated for a block to correspond to multiple corners so that these multiple models may be used in a multi-mode, multi-corner analysis.

The interface model generated or identified at 308A may be inserted into a netlist of the second die design at 310A. In some embodiments, an interface model may be inserted into the second die design to replace the block based on which the interface model is generated. In some other embodiments, an interface model may be inserted into the second die design while the block based on which the interface model is generated may be suppressed or hidden from the users and/or the EDA tools.

A determination may be made at 312A to decide whether one or more blocks of circuit component designs still exist and may be modeled as one or more corresponding interface models in the second die design. If the determination result is affirmative, the process may return to 302A to identify another block of circuit component designs and repeat the aforementioned actions from 302A through 312A until all desired or required blocks have been represented by their corresponding interface models. Otherwise, the process illustrated in FIG. 3A for generating a wrapper design for the second die at 204 of FIG. 2 may proceed to 206 of FIG. 2 described above.

Figure 3B:
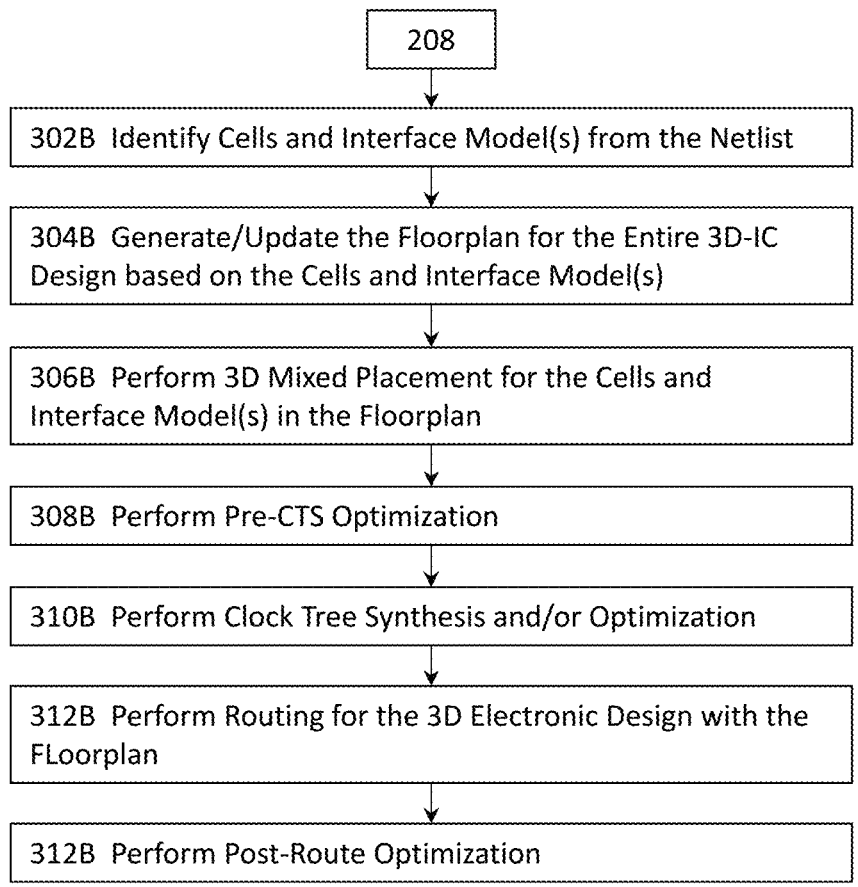
FIG. 3B illustrates more details about another portion of FIG. 2 for efficiently implementing a three-dimensional integrated circuit (3D-IC) design with heterogeneous and/or homogeneous dies, according to some embodiments.

FIG. 3B illustrates more details about another portion of FIG. 2 for efficiently implementing a three-dimensional integrated circuit (3D-IC) design with heterogeneous and/or homogeneous dies, according to some embodiments. More particularly, FIG. 3B illustrates more details about concurrent implementation for both the first die design and the second die at 208 of FIG. 2. In these embodiments, a plurality of interfaces models and a plurality of cells, blocks, macros, etc. that are not represented by corresponding interface models may be identified at 302B. In an example of a memory-on-logic 3D-IC, various blocks, cells, or macros, etc. in the memory die may be represented as corresponding interface models, while various cells, blocks, or macros, etc. in the logic die may be represented as the original design data. In this example, the blocks, cells, or macros, etc. in the logic die and the corresponding interface models in the memory die. It shall be noted that a logic die design may include regular circuit component designs as in other electronic designs but not wrapper designs or cover cells in some embodiments, while a logic die design may include both circuit component designs and wrapper design(s) or cover cell(s) in some other embodiments.

The floorplan for the 3D-IC may be generated (if non-existing) or updated (if already generated) at 304B for the entire 3D-IC design based at least in part upon the cells, blocks, macros, etc. and the interface models identified at 302B. In some of these embodiments illustrated in FIG. 3B, the floorplan comprises the top-level (e.g., the highest level) floorplan of the 3D-IC design. 3D mixed placement may be performed at 306B for at least the cells, blocks, macros, etc. and the interface models identified at 302B. In some embodiments, 3D mixed placement places the 3D-IC design on the floorplan generated or updated at 304B with 3D concurrent macro and cell placement and allows cells, blocks, macros, etc. to be placed on multiple different planes while still optimizing various metrics (e.g., power, performance, and area or PPA metrics).

It shall be noted that the density and/or area of one die may or may not exactly match the area and/or density of another die in a 3D-IC. As a result, it is possible that the size allocated to the floorplan for the one die may not be enough to hold the required circuit component designs, while too much size may be allocated for another die that. There are multiple approaches that may be adopted to address this issue, if necessary. One possible approach is to increase the size of the floorplan of the die(s) to accommodate the shortfall in some embodiments. Another possible approach in some other embodiments is using the 3D mixed placement process to place some of the circuit component designs from one die onto another die.

In some embodiments, a 3D mixed placer concurrently places both the first and the second dies. In addition, the 3D mixed placer may optimize the instance locations based at least in part one or more metrics (e.g., PPA metrics). For example, the 3D mixed placer may optimize the instance locations according to variables such as timing, density, wire length, floorplan constraints, or any other suitable constraints, or any combinations thereof. A 3D mixed placer may perform 3D mixed placement based at least in part upon one or more factors such as, without limitation, characteristics of through-silicon vias (TSVs), the power and/or ground structures, placement of electrostatic discharge (ESD) cell(s) for protection, one or more testing structures, one or more cells pertaining to 3D manufacturing, or any other desired or required factors, or any combinations thereof.

After the cells, blocks, macros, and interface models are placed, the current state of the 3D-IC design may be unfolded. An unfolding action unfolds the vertical stacking of the multiple dies from the results of the 3D mixed placement described above so that the 3D-IC design may be physically configured into a 2D representation having each die's floorplan according to the die orientation and placement location, and logically partitioned to each die's hierarchical module with feedthrough insertion.

With various blocks, macros, cells, and the interface modules placed at 306B, other physical implementations may be performed. For example, pre-clock tree synthesis (pre-CTS) optimization may be performed at 308B; clock-tree synthesis and/or optimization may be performed at 310B; the 3D-IC design may be routed at 312B; and post-route optimization may be performed at 312B.

Figure 3C:
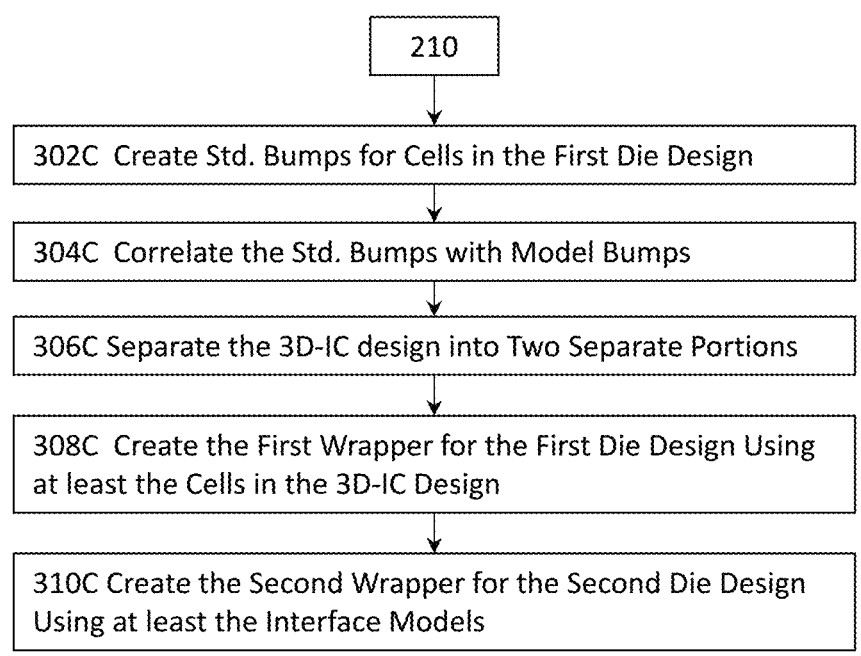
FIG. 3C illustrates more details about a separate portion of FIG. 2 for efficiently implementing a three-dimensional integrated circuit (3D-IC) design with heterogeneous and/or homogeneous dies, according to some embodiments.

FIG. 3C illustrates more details about a separate portion of FIG. 2 for efficiently implementing a three-dimensional integrated circuit (3D-IC) design with heterogeneous and/or homogeneous dies, according to some embodiments. More particularly, FIG. 3C illustrates more details about separating the 3D-IC design into multiple wrappers at 210 of FIG. 2. In these embodiments, the 3D-IC design now includes cells, macros, blocks, etc. (collectively cell for singular reference or cells for plural reference) with design data as well as interface models with reduced design data. One or more bumps may be created at 302C for the corresponding pins, terminals, ports, etc. of these various cells remaining in the 3D-IC design. In some embodiments, a bump may be created for each pin, terminal, or port of the input or the output of a cell.

When some cells, macros, or blocks, etc. were modeled as corresponding interface models (e.g., in FIG. 3A), bumps may also be created for these interface models (e.g., at 306A of FIG. 3A). To distinguish the bumps created at 306A from the bumps created 302C, the bumps created at 306A for the interface models may be referred to as model bumps; and the bumps created at 302C may be referred to as standard bumps. These two types of bumps created at 306A and 302C may be correlated at 304C based at least in part upon, for example, the interconnection or netlist connecting the first and the second die designs in some embodiments.

The 3D-IC design may be separated into two portions at 306C. A first wrapper may be created for the first portion at 308C; and a second wrapper may be created for the second portion at 310C. In some embodiments, a 3D-IC design may be separated based on the die designs such that the circuit component designs of the first die design are grouped into a first portion, and those of the second die design are grouped into a second portion. For example, in a memory-on-logic 3D-IC, a memory die wrapper may be generated for circuit blocks represented with corresponding interface models, and a logic die wrapper may be generated for the circuit blocks or cells of the logic die. It shall be noted that although some embodiments refer to two die designs, various techniques described herein can be applied with full and equal effects to 3D-IC designs having more than two die designs.

In some embodiments, a 3D-IC design may be separated at 306C by grouping all the interface models (e.g., timing models such as ILMs, flexILMs, ETMs, etc.) into a first portion and the remaining circuit component designs into a second portion. A first wrapper may then be generated at 308C for the first portion including the aforementioned interface models (but not the remaining circuit component designs); and a second wrapper may then be generated at 310C for the second portion including the aforementioned remaining circuit component designs but not the aforementioned interface models. Other ways of separating a 3D-IC design may also be adopted so long as the separation supports concurrent implementation of the entire 3D-IC design, which has some blocks represented by corresponding interface models, by using one or more techfiles that support the technology nodes on one die but not the technology nodes on other die(s).

With the wrappers generated at 308C and 310C, bumps representing bonding or hybrid bonding between the first and the second dies may be created and assigned for the wrapper having no interface models (e.g., timing models) based at least in part upon, for example, the model bumps created at 306A for the interface models. Once the bump generation and assignment are complete, the 3D-IC concurrent implementation may be deemed complete and may be separated into two separate dies for tasks such as timing sign-off, power sing-off, or any other sign-off tasks, etc.

Figure 3D:
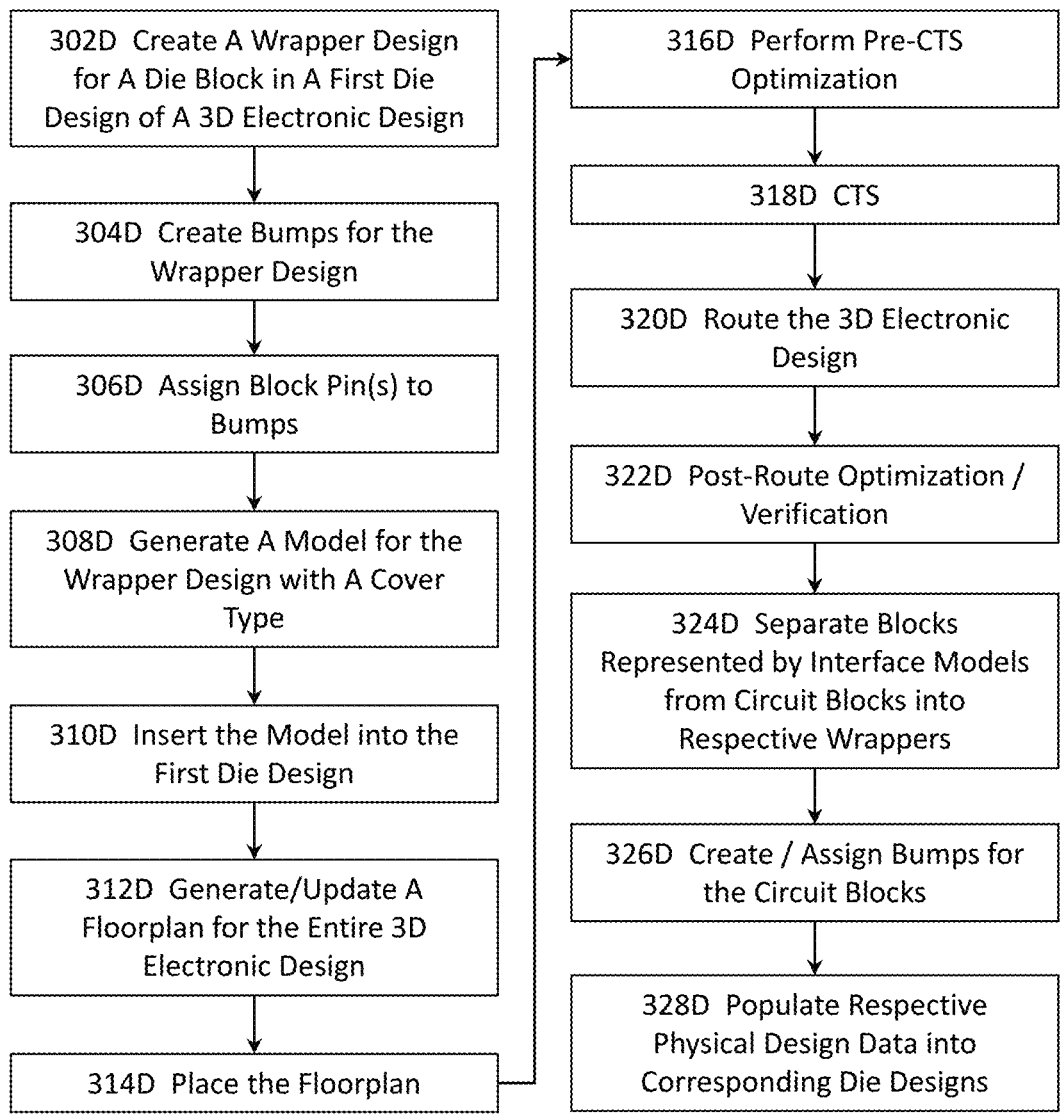
FIG. 3D illustrates a more detailed block diagram for efficiently implementing a three-dimensional integrated circuit (3D-IC) design with heterogeneous and/or homogeneous dies, according to some embodiments.

FIG. 3D illustrates a more detailed block diagram for efficiently implementing a three-dimensional integrated circuit (3D-IC) design with heterogeneous and/or homogeneous dies, according to some embodiments. In these embodiments, a wrapper design may be created at 302D for a block of circuit component designs in a first die of a 3D electronic design. The 3D electronic design comprises multiple dies in these embodiments, and various techniques described herein provide improved methods and systems to concurrently implement the 3D electronic design in a single EDA tool session.

One or more bumps (or model bumps as described above with reference to 306A) may be created at 304D for the wrapper design created at 302D. The pin(s), terminal(s), port(s), etc. of the wrapper design may be assigned at 306D to the one or more bumps created at 304D so that the wrapper design may be corrected interconnected to external circuit component(s) outside the wrapper design and/or internal circuit component(s) within the wrapper design. A model may then be generated at 308B based at least in part upon the wrapper design for the block in the first die design.

The model generated at 308D may be inserted into the first die design or a copy thereof at 310D. In some embodiments, the block in the first die design may be replaced by the model at 310D while in some other embodiments, the model may be inserted into the first die design or a copy thereof although the block and its design details may be hidden or suppressed so that the model is exposed to various EDA tools that are used to implement the 3D electronic design.

A floorplan may be generated (if not already generated) or updated at 312D for the entire 3D electronic design including the first die design and at least one other die design. For example, the process may start with an initial netlist, where the size of the floorplan may be configured such that in a vertically stacked arrangement of multiple dies of the 3D electronic design, the size of the floorplan selected for each die may be approximately half of the size of a comparable floorplan if implemented as a 2D design. It is noted that the multiple dies in the 3D electronic design may also correspond to their respective, different die sizes. It is further noted that although some electronic design cycles begin with a floorplan for which a layout is subsequently generated, in some embodiments where the boundaries and thus distinctions between floorplans and layouts are blurred, a layout may also be generated or updated at 312D for substantially similar or identical purposes.

In some embodiments, the blocks, cells, macros, etc. on each of the multiple die designs may or may not have the same area and/or density. In some embodiments where a set of cells, macros, blocks, etc. on one die have different areas and/or densities, this set of cells may be planned for two separate die designs (e.g., a portion of the set on the first die design and the remainder of the set on another die design) so as to reduce or minimize the size of the floorplan (and hence the sizes of each individual die design as well as the overall stacked 3D electronic design).

Various physical implementations may be performed based on the floorplan. For example, placement may be concurrently performed at 314D for the floorplan generated or updated at 312D for the entire 3D electronic design to determine the locations of each circuit component design in the floorplan. In some embodiments, placement may be performed by using, for example, mixed placement techniques as described above with reference to 306B of FIG. 3B. Other physical implementations may also be concurrently performed for the entire 3D electronic design in a single EDA tool session. For example, pre-clock tree synthesis (pre-CTS) optimization may be concurrently performed for the entire 3D electronic design at 316D; and clock tree synthesis and/or optimization may be concurrently performed for the entire 3D electronic design at 318D.

In addition, routing may be concurrently performed for the entire 3D electronic design to interconnect circuit component designs at 320D; and post-route optimization and/or verification may also be concurrently performed for the entire 3D electronic design at 322D.

The 3D electronic design may then be separated at 324D into multiple die designs in an identical or a substantially similar manner described above with reference to 306C of FIG. 3C. In some embodiments, a 3D electronic design may be separated based on the die designs such that the circuit component designs of the first die design are grouped into a first portion, and those of the second die design are grouped into a second portion. In some other embodiments, a 3D electronic design may be separated by grouping all the interface models into a first wrapper and the remaining circuit component designs into a second wrapper. Other ways of separating a 3D electronic design may also be adopted so long as the separation supports concurrent implementation of the entire 3D-IC design, which has some blocks represented by corresponding interface models, by using one or more techfiles that support the technology nodes on one die but not the technology nodes on other die(s).

Bumps may be created and assigned at 326D for pin(s), terminal(s), port(s), etc. of the circuit blocks based at least in part upon the bumps created for the wrapper design at 304D and assigned at 306D. With the bumps created and assigned at 326D, the bumps for the first wrapper are correlated with the bumps for the second wrapper, and the 3D electronic design may be correctly interconnected even when one or more blocks in the original 3D electronic design have been represented as one or more respective interface models.

Each of the multiple die designs may be populated with or correspond to its respective physical design data at 328D. For example, the aforementioned 3D electronic design may be separated into two separate die designs, and the respective physical design data, including the physical design data corresponding to the wrapper designs, may be attributed to each of the die designs so that sign-off tasks (e.g., timing sign-off, power sign-off, front-end sign-off, back-end sign-off, etc.) may be performed each individual die design before the 3D electronic design may be taped out for fabrication.

Figure 4:
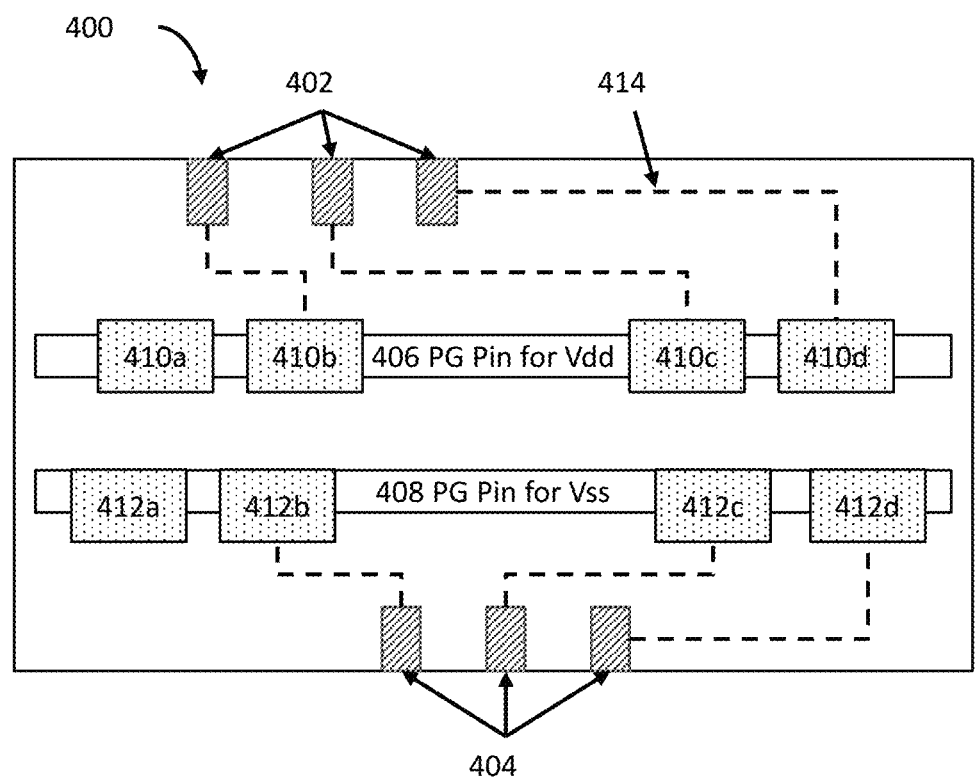
FIG. 4 illustrates a simplified example of a portion of a 3D-IC design with power connections, according to some embodiments.

FIG. 4 illustrates a simplified example of a portion of a 3D-IC design with power connections, according to some embodiments. More specifically, this simplified example illustrates an example of connecting a plurality of first pins 402 to corresponding bumps (e.g., 410*b*, 410*c*, and 410*d*) along the Vdd PG rail 406 and connecting a plurality of second pins 404 to the corresponding bumps (e.g., 412*b*, 412*c*, and 412*d*) along the Vss PG rail 408. The pin or terminal 410*a* represents a reserved pin or terminal for Vdd; and the pin or terminal 412*a* represents a reserved pin or terminal for Vss in this example. The dashed line (e.g., 414) graphically represents a pin-to-bump assignment or correlation although such correlation or assignment may be implemented in any other suitable manner.

Figure 5A:
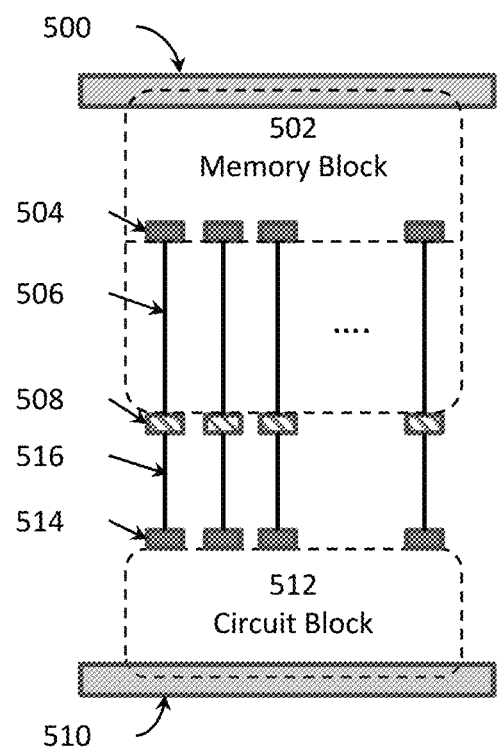
FIGS. 5A-5D illustrate some simplified examples of 3D-ICs with multiple dies, according to some embodiments described in the present disclosure.

FIGS. 5A-5D illustrate some simplified examples of 3D-ICs with multiple dies, according to some embodiments described in the present disclosure. More specifically, FIG. 5A illustrates an example face-to-face 3D electronic design (e.g., the device sides of two dies are facing each other) that includes a first die having a first substrate 500 (e.g., a single crystal silicon) upon which first electronic circuit component designs 502 are located. The first electronic circuit component designs 502 may include, for example, one or more pins 504, one or more bumps or micro-bumps 508, and one or more interconnects between the one or more pins and the one or more corresponding bumps 508 as well as other blocks, cells, and/or macros of circuit component designs that are not shown for the ease of illustration and description. In addition to the aforementioned bumps or micro-bumps or in the alternative, other interconnection technologies such as hybrid bonding, through-silicon vias (TSVs) may also be employed for integrating multiple semiconductor dies into a 3D-IC. More details about hybrid bonding are described below with reference to FIG. 5D.

The example 3D electronic design in FIG. 5A further includes a second substrate upon which second electronic circuit component designs are located. These second electronic circuit components 512 may also include one or more bumps or micro-bumps 514 (or hybrid bonding, TSVs, etc.) that are interconnected via one or more corresponding interconnects 516 to the bumps or micro-bumps 508 (or hybrid bonding, TSVs, etc.) of the first electronic circuit component designs of the upper die design.

In some embodiments, the example 3D-IC illustrated in FIG. 5A illustrates a memory die on the first substrate 500 and a logic die having one or more blocks, cells, macros, etc. on the second substrate 510. It shall be noted that although these embodiments illustrated in FIGS. 5A-5D refer to a memory die and a logic die as in a memory-on-logic 3D-IC, the reference to and illustration of a memory die and a logic die are merely for the ease of illustration and description and are not intended to limit other embodiments or claims that may encompass dies other than a memory die or a logic die illustrated in FIGS. 5A-5D and described herein.

Figure 5B:
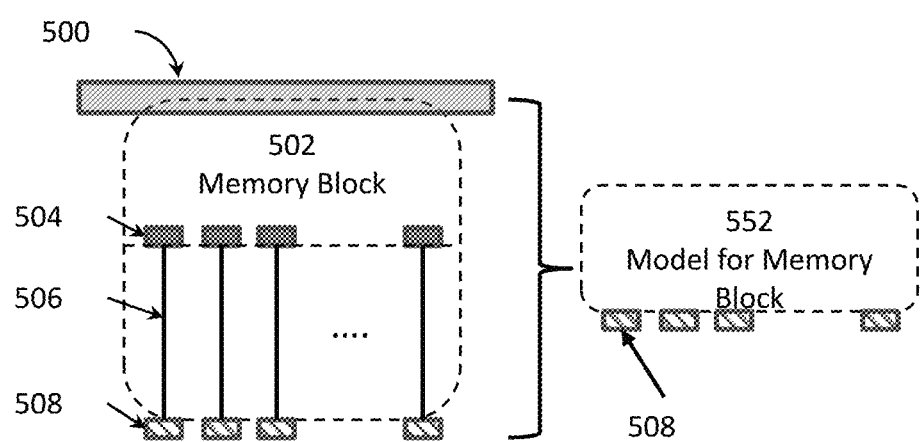
Figure 6:
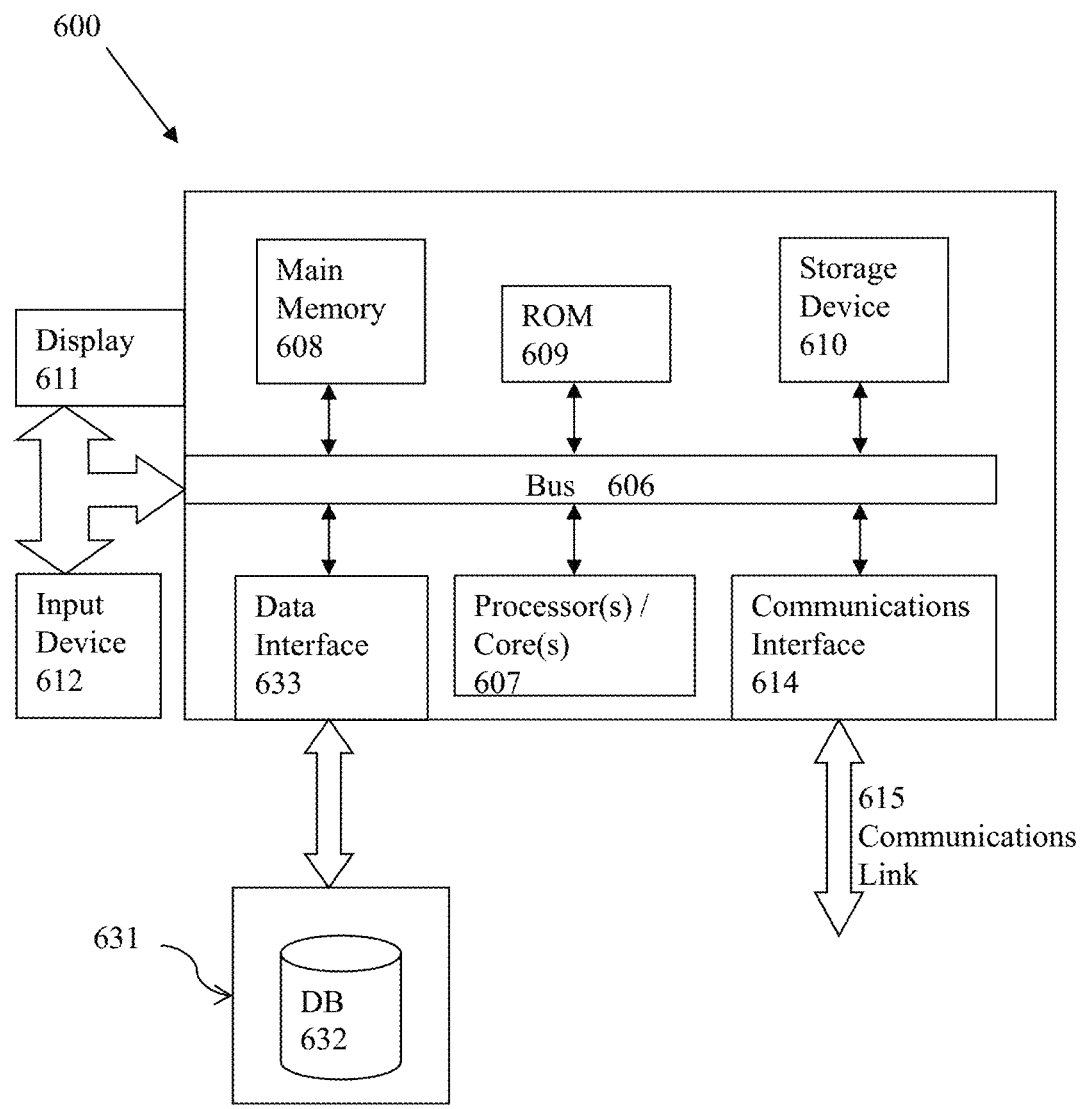
FIG. 6 illustrates a block diagram of an illustrative computing system suitable for implementing some embodiments of the present disclosure, according to some embodiments.

FIG. 5B illustrates an example modeling of the memory die on the first substrate 500 for the 3D-IC design illustrated in FIG. 5A. In some embodiments, a memory block 502 in the example memory die on the first substrate 500 may be represented as a model 552 (e.g., an interface model such as an ILM, a flexILM, an ETM, etc. described above) by using the techniques described above with reference to, for example, FIG. 3A.

In some embodiments where the memory block 502 corresponds to or includes one or more pins, terminals, ports, etc. that are connected to one or more bumps or micro-bumps 508 (or hybrid bonding, TSVs, etc.) as illustrated in FIG. 5B, corresponding bumps or micro-bumps (or hybrid bonding, TSVs, etc.) may also be created or translated to the model 552 so that the model 552 can be correctly interconnected.

Figure 5C:
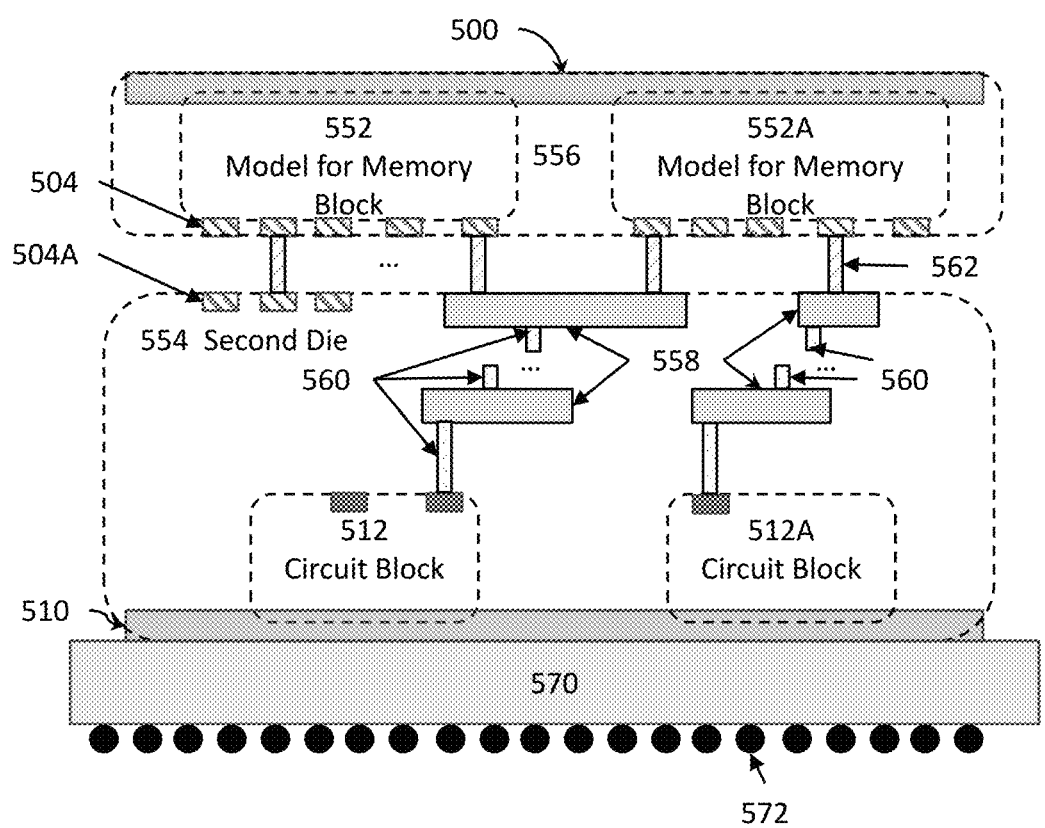

FIG. 5C illustrates more details about the example face-to-face 3D electronic design illustrated in FIG. 5A with the modeling illustrated in FIG. 5B, according to some embodiments. In these embodiments, the first die 556 includes a first substrate 500 on which a first model 552 and a second model 552A are located. Each of the first model 552 and the second model 552A has one or more bumps or micro-bumps 504 (or hybrid bonding, TSVs, etc.) that may be interconnected with another die via, for example, one or more interconnects or bonding structures (e.g., hybrid bonding structures) 562.

The example 3D electronic design in FIG. 5C further includes a second die design 554. The second die design further includes a second semiconductor substrate 510 on which a plurality of cells, macros, or circuit blocks, etc. 512 and 512A are located. The second die design 554 may include one or more additional layers 558 that may be interconnected by, for example, corresponding vias 560 atop the cells, macros, or circuit blocks, etc. (512 and 512A). The entire 3D electronic design may be packaged with the packaging materials 570 (which is schematically shown in FIG. 5C) that further provide conductive leads 572 that may be soldered to, for example, a printed circuit board to electrically and mechanically connect the IC package to the printed circuit board.

Figure 5D:
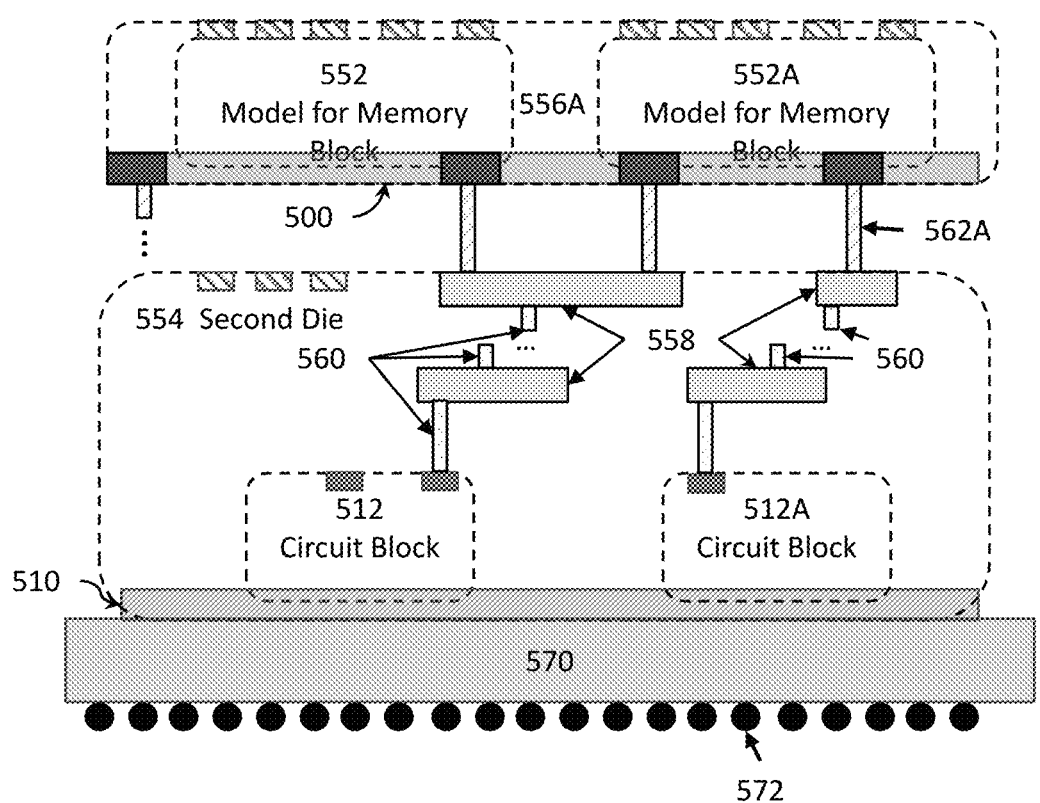

FIG. 5D illustrates another simplified example 3D electronic design in a face-to-bottom configuration, according to some embodiments. The simplified example 3D electronic design includes a first die design 556A that further includes a plurality of models 552 and 552A that may be similarly implemented as shown in FIG. 5B and described above with reference to FIG. 3A.

The first die design may be interconnected with a second die design 554A by using, for example, through-silicon vias (TSVs), interconnects, hybrid bonding, etc. In some embodiments, there may exist a bonding layer between the first semiconductor substrate 500 the second die design 554A. Hybrid bonding may be achieved with oxide-to-oxide initial bond at some lower temperature (e.g., room temperature)

followed by heating that closes the gaps and may be further followed by additional heating that compresses metal without using external pressure.

The second die design 554A, like the second die design 554 in FIG. 5C, may include a plurality of cells, macros, or blocks, etc. (512, 512A) and one or more layers 558 (e.g., metal layers) that may be further interconnected with, for example, corresponding vias 560. Also similar to the example 3D electronic design illustrated in FIG. 5C, the simplified example 3D electronic design in FIG. 5D design may also be packaged with the packaging materials 570 (which is schematically shown in FIG. 5C) that further provide conductive leads 572 that may be soldered to, for example, a printed circuit board to electrically and mechanically connect the IC package to the printed circuit board.

DESCRIPTION OF SPECIFIC EMBODIMENT(S)

In some embodiments, an approach is described to implement three-dimensional integrated circuit (3D-IC) designs with two-dimensional unfolding and shadow bump assignment, particularly in some embodiments for memory-on-logic 3D-IC implementations.

By unfolding the vertical stacking of the multiple dies, the 3D-IC design is physically partitioned into each die's floorplan according to the die orientation and placement location, and logically partitioned to each die's hierarchical module with feedthrough insertion.

Similar to partition pin assignment in 2D hierarchical implementation flow, shadow bumps are assigned on 3D-IC die-to-die interface based on the routing topology before unfolding. In favor of the buffering requirement of certain 3D stacking scenario, such like Memory-on-Logic stacking, shadow bump and module port cloning could be performed on the multi-fanout cross-die nets.

With unfolded design, the IC backend implementation flow such like placement, timing optimization, clock tree synthesis and routing can run concurrently on multiple dies without any form of budgeting or die modeling. The method removes the need of die-by-die iteration and better improve the performance, power and area result of a 3D-IC design.

A three-dimensional integrated circuit (3D-IC) refers to integrated circuit device manufactured by stacking multiple dies and connected vertically by TSVs bumps, or hybrid-bonding, so that it can achieve higher performance, reduced power and smaller footprint than conventional two-dimensional integrated circuit.

Although the 3D-IC is a single device from a system point of view, but usually the physical implementation of each die is performed separately due to the limitation of mainstream commercial EDA tools. A typical flow of such die-by-die implementation usually starts from the most critical die and those bumps and TSVs with specific requirement. After one die has its bumps placed and assigned, the bump location information is passed to its neighboring dies. To optimize the bump connection across dies, co-design iterations are needed to achieve better performance, power, and area (PPA) result.

For high performance 3D-ICs whose two neighboring dies have large number of cross-die timing paths, the above-mentioned manual co-design method is far from sufficient to optimize PPA. Because when the cross-die timing path is cut into 2 separate dies, either timing budgeting or modeling is required for each die's optimization to see the delay, transition and the load of the other half of the timing path. In most cases, it is very difficult to make the timing budgeting accurate, as it is essentially a prediction of the path delay before the optimization.

Particularly, Memory-on-Logic 3D-IC is one of the challenging applications that is difficult to be implemented with the die-by-die flow. Memory-on-Logic 3D-IC is a design with logic cells (registers and combinational logics) and memory hard macros while putting the memories on one die and the logic cells on the other die. The two dies are stacked as a 3D-IC device with hybrid-bonding or equivalent technology connecting them. The implementation challenges not only include the timing budgeting and modeling problem, but also includes the placement of the memory macros. Because the placement of the memories needs to be optimized according to the placement of the logic cells. In die-by-die flow, each die is implemented separately so they cannot see each other.

Some embodiments of the present disclosure introduce an implementation method of Memory-on-Logic 3D-IC with mixed placement, two-dimensional unfolding and shadow bump assignment. The method concurrently places both the macros, circuit blocks, and/or cells and optimize the instance locations by timing, density, wire length and floorplan constraint. The bumps between the two dies could be created at the optimal location according to the macro, circuit block, and/or cell placement. With two-dimensional unfolding, timing/power/area optimization, clock tree synthesis and routing can run concurrently on multiple dies without any form of budgeting or die modeling. The method removes the need of die-by-die iteration and better improve the performance, power and area result of the Memory-on-Logic design.

Here is the flow of the current embodiment: (1) Create a floorplan with die box of the same size as the two-dimensional footprint of the Memory-on-Logic design; (2) Place the design on the floorplan with 3D concurrent macro, circuit block, and/or cell placement (3D mixed placement). The 3D mixed placer is enhanced from existing 2D mixed placer by allowing the macro, circuit blocks, and/or cells be placed on two different planes while still optimizing all the PPA metrics; (3) Create module wrapper for the memory die and logic die if the original netlist of the design is not partitioned yet into two modules; (4) create feedthrough net and ports on the die that connects to the package (e.g., logic die). This is used because the signals between the other die and package have to cross this die; (5) Clone multiple fanout input ports of the macro die to reduce the fanout to 1. This is used if buffering is not allowed on the memory die; (6) Assign shadow bump between memory die and logic die based on the memory pin location. The shadow bump is the pair of bumps representing the hybrid-bonding between the two dies; (7) Insert zero delay cells at the shadow bump location to make timing delay calculation regard the delay as zero between the shadow bumps after unfolding the floorplan; (8) Physically unfold the 3D stacked design's floorplan into a 2D floorplan; (9) Create power planning for the two dies; (10) Run rest of the implementation steps: pre-CTS optimization, clock tree synthesis and optimization, routing and post-route optimization; (11) Remove the zero delay cells; (12) Break the design into 2 separate dies for sign-off.

In another embodiment, an approach is provided for a three-dimensional integrated circuit (3D-IC) implementation with mixed macro, circuit block, and cell placement. This approach concurrently places both the macros, cells, and/or circuit blocks of the 3D-IC design onto two or more stacked floorplan and optimize the instance locations by timing, density, wire length and floorplan constraint. By allowing the instance overlapping on the stacked dies and modeling the vertical RC parasitic, timing, density, wire length and congestion cost across dies, the macros, cells, and/or circuit blocks on the multiple dies can be placed concurrently to achieve PPA (performance, power, area) optimized placement locations analytically without any form of budgeting or user interactive or scripting iteration between dies.

SYSTEM ARCHITECTURE OVERVIEW

FIG. 6 is a block diagram of an illustrative computing system 600 suitable for implementing an embodiment of the present disclosure. Computer system 600 includes a bus 606 or other communication mechanism for communicating information, which interconnects subsystems and devices, such as processor 607, system memory 608 (e.g., RAM), static storage device 609 (e.g., ROM), disk drive 610 (e.g., magnetic or optical), communication interface 614 (e.g., modem or Ethernet card), display 611 (e.g., CRT or LCD), input device 612 (e.g., keyboard), and cursor control.

The illustrative computing system 600 may include an Internet-based computing platform providing a shared pool of configurable computer processing resources (e.g., computer networks, servers, storage, applications, services, etc.) and data to other computers and devices in a ubiquitous, on-demand basis via the Internet in some embodiments. For example, the computing system 600 may include or may be a part of a cloud computing platform (e.g., a public cloud, a hybrid cloud, etc.) where computer system resources (e.g., storage resources, computing resource, etc.) are provided on an on-demand basis, without direct, active management by the users in some embodiments.

According to one embodiment of the present disclosure, computer system 600 performs specific operations by processor 607 executing one or more sequences of one or more instructions contained in system memory 608. Such instructions may be read into system memory 608 from another computer readable/usable medium, such as static storage device 609 or disk drive 610. In alternative embodiments, hard-wired circuitry may be used in place of or in combination with software instructions to implement the present disclosure. Thus, embodiments of the present disclosure are not limited to any specific combination of hardware circuitry and/or software. In one embodiment, the term "logic" shall mean any combination of software or hardware that is used to implement all or part of the present disclosure.

The term "computer readable medium" or "computer usable medium" as used herein refers to any medium that participates in providing instructions to processor 607 for execution. Such a medium may take many forms, including but not limited to, non-volatile media and volatile media. Non-volatile media includes, for example, optical or magnetic disks, such as disk drive 610. Volatile media includes dynamic memory, such as system memory 608.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the present disclosure, execution of the sequences of instructions to practice the present disclosure is performed by a single computer system 600. According to other embodiments of the present disclosure, two or more computer systems 600 coupled by communication link 615 (e.g., LAN, PTSN, or wireless network) may perform the sequence of instructions required to practice the present disclosure in coordination with one another.

Computer system 600 may transmit and receive messages, data, and instructions, including program, e.g., application code, through communication link 615 and communication interface 614. Received program code may be executed by processor 607 as it is received, and/or stored in disk drive 610, or other non-volatile storage for later execution. Computer system 600 may communicate through a data interface 633 to a database 632 on an external storage device 631.

In the foregoing specification, the present disclosure has been described with reference to specific embodiments thereof. It will, however, be evident that various modifications and changes may be made thereto without departing from the broader spirit and scope of the present disclosure. For example, the above-described process flows are described with reference to a particular ordering of process actions. However, the ordering of many of the described process actions may be changed without affecting the scope or operation of the present disclosure. The specification and drawings are, accordingly, to be regarded in an illustrative rather than restrictive sense.

What is claimed is:

1. A method for concurrently implementing a three-dimensional (3D) electronic design using an electronic design automation tool, comprising:

identifying a first die design and a second die design in a three-dimensional (3D) electronic design, wherein the first die design requires a first technology file, and the second die design requires a second technology file different from the first technology file; and performing the concurrent implementation for both the first and the second dies of the 3D electronic design using only one of the first and second technology files loaded into an electronic design automation tool session at a time comprising:

generating wrapper designs for circuit component designs in the second die design, wherein use of the wrapper designs does not require use of the second technology file to perform at least floorplanning and a wrapper design comprises a representation of a corresponding circuit component design as a timing or interface model, a footprint, and one or more connections to the first die design; and generating, concurrently, a floorplan for both the first and the second dies of the 3D electronic design using at least the wrapper designs for the circuit component designs in the second die design, the first die design, the first technology file, and without using the second technology file.

2. The method of claim 1, wherein generating the wrapper design comprises:

identifying a block, cell, instance, or macro of the circuit component designs from the second die design;

identifying a pin in the block, cell, instance, or macro of the circuit component designs;

identifying a size or boundary of the block, cell, instance, or macro of the circuit component designs; and creating a model bump for the pin of the block, cell, instance, or macro of the circuit component designs.

3. The method of claim 2, wherein generating the wrapper design further comprises:

modeling the block, cell, instance, or macro of the circuit component designs and the model bump as a timing or interface model based at least in part upon the size or boundary of the block, cell, instance, or macro of the circuit component designs; and inserting the timing or interface model into the second die design.

4. The method of claim 2, wherein generating the wrapper design further comprises:

creating a standard bump for a block, cell, instance, or macro of circuit component designs in the second die design of the 3D electronic design; and correlating the standard bump for the block, cell, instance, or macro of circuit component designs in the second die design with the model bump for the block, cell, instance, or macro of circuit component designs in the first die design.

5. The method of claim 1, wherein concurrent implementation is supported with only one technology file.

6. The method of claim 1, wherein performing the concurrent implementation for both the first and the second dies of the 3D electronic design using only one of the first and second technology files loaded into an electronic design automation tool session at a time further comprises:

identifying one or more blocks, cells, instances, or macros of circuit component designs in the first die design of the 3D electronic design;

identifying one or more timing or interface models from the second die design of the 3D electronic design; and generating or updating the floorplan for the first and the second die designs of the 3D electronic design based at least in part upon identification of the one or more blocks, cells, instances, or macros and the one or more timing or interface models.

7. The method of claim 6, wherein performing the concurrent implementation for both the first and the second dies of the 3D electronic design using only one of the first and second technology files loaded into an electronic design automation tool session at a time further comprises:

performing mixed placement for the one or more blocks, cells, instances, or macros and the one or more timing or interface models in the floorplan of the 3D electronic design; and performing pre-clock tree synthesis or optimization for the one or more blocks and the one or more timing or interface models in the floorplan of the 3D electronic design.

8. The method of claim 7, wherein performing the concurrent implementation for both the first and the second dies of the 3D electronic design using only one of the first and second technology files loaded into an electronic design automation tool session at a time further comprises:

performing clock tree synthesis or optimization for the one or more blocks, cells, instances, or macros and the one or more timing or interface models in the floorplan of the 3D electronic design;

performing routing for the one or more blocks, cells, instances, or macros and the one or more timing or interface models in the floorplan of the 3D electronic design; and performing post-route optimization or verification for the one or more blocks, cells, instances, or macros and the one or more timing or interface models in the floorplan of the 3D electronic design.

9. The method of claim 1, wherein the 3D electronic design comprises a memory-on-logic electronic design, the timing or interface model comprises an interface logic model, a flexible interface logic model, quick time model, or an extracted timing model, and the concurrent implementation of the 3D electronic design is performed for both the first and the second die designs using a single electronic design automation (EDA) tool session.

10. A non-transitory computer readable medium having stored thereupon a sequence of instructions which, when executed by a processor causes a set of acts for concurrently implementing a three-dimensional (3D) electronic design using an electronic design automation tool, the set of acts comprising:

identifying a first die design and a second die design in a three-dimensional (3D) electronic design, wherein the first die design requires a first technology file, and the second die design requires a second technology file different from the first technology file; and performing the concurrent implementation for both the first and the second dies of the 3D electronic design using only one of the first and second technology files loaded into an electronic design automation tool session at a time comprising:

generating wrapper designs for circuit component designs in the second die design, wherein use of the wrapper designs does not require use of the second technology file to perform at least floorplanning and a wrapper design comprises a representation of a corresponding circuit component design as a timing or interface model, a footprint, and one or more connections to the first die design; and generating, concurrently, a floorplan for both the first and the second dies of the 3D electronic design using at least the wrapper designs for the circuit component designs in the second die design, the first die design, the first technology file, and without using the second technology file.

11. The non-transitory computer readable medium of claim 10, wherein generating the wrapper design comprises:

identifying a block, cell, instance, or macro of the circuit component designs from the second die design;

identifying a pin in the block, cell, instance, or macro of the circuit component designs;

identifying a size or boundary of the block, cell, instance, or macro of the circuit component designs; and creating a model bump for the pin of the block, cell, instance, or macro of the circuit component designs.

12. The non-transitory computer readable medium of claim 11, wherein concurrent implementation is supported with only one technology file.

13. The non-transitory computer readable medium of claim 11, wherein generating the wrapper design further comprises:

creating a standard bump for a block, cell, instance, or macro of circuit component designs in the second die design of the 3D electronic design; and correlating the standard bump for the block, cell, instance, or macro of circuit component designs in the second die design with the model bump for the block, cell, instance, or macro of circuit component designs in the first die design.

14. The non-transitory computer readable medium of claim 11, wherein generating the wrapper design further comprises:

creating a model bump for the pin of the block, cell, instance, or macro of the circuit component designs;

modeling the block, cell, instance, or macro of the circuit component designs and the model bump as a timing or interface model based at least in part upon the size or boundary of the block, cell, instance, or macro of the circuit component designs; and inserting the timing or interface model into the second die design.

15. The non-transitory computer readable medium of claim 10, wherein performing the concurrent implementation for both the first and the second dies of the 3D electronic design using only one of the first and second technology files loaded into an electronic design automation tool session at a time further comprises:
   identifying one or more blocks, cells, instances, or macros of circuit component designs in the first die design of the 3D electronic design;
   identifying one or more timing or interface models from the second die design of the 3D electronic design; and
   generating or updating the floorplan for the first and the second die designs of the 3D electronic design based at least in part upon identification of the one or more blocks, cells, instances, or macros and the one or more timing or interface models;
   performing mixed placement for the one or more blocks, cells, instances, or macros and the one or more timing or interface models in the floorplan of the 3D electronic design; and
   performing pre-clock tree synthesis or optimization for the one or more blocks and the one or more timing or interface models in the floorplan of the 3D electronic design.

16. The non-transitory computer readable medium of claim 15, wherein performing the concurrent implementation for both the first and the second dies of the 3D electronic design using only one of the first and second technology files loaded into an electronic design automation tool session at a time further comprises:
   performing clock tree synthesis or optimization for the one or more blocks, cells, instances, or macros and the one or more timing or interface models in the floorplan of the 3D electronic design;
   performing routing for the one or more blocks, cells, instances, or macros and the one or more timing or interface models in the floorplan of the 3D electronic design; and
   performing post-route optimization or verification for the one or more blocks, cells, instances, or macros and the one or more timing or interface models in the floorplan of the 3D electronic design.

17. The non-transitory computer readable medium of claim 10, wherein the 3D electronic design comprises a memory-on-logic electronic design, the timing or interface model comprises an interface logic model, a flexible interface logic model, quick time model, or an extracted timing model, and the concurrent implementation of the 3D electronic design is performed for both the first and the second die designs using a single electronic design automation (EDA) tool session.

18. A system for concurrently implementing a three-dimensional (3D) electronic design using an electronic design automation tool, the system comprising:
   a memory storing a set of instructions; and
   a processor that that executes the set of instructions to perform a set of acts, the set of acts comprising:
      identifying a first die design and a second die design in a three-dimensional (3D) electronic design, wherein the first die design requires a first technology file, and the second die design requires a second technology file different from the first technology file; and
      performing the concurrent implementation for both the first and the second dies of the 3D electronic design using only one of the first and second technology files loaded into an electronic design automation tool session at a time comprising:
         generating wrapper designs for circuit component designs in the second die design, wherein use of the wrapper designs does not require use of the second technology file to perform at least floorplanning and a wrapper design comprises a representation of a corresponding circuit component design as a timing or interface model, a footprint, and one or more connections to the first die design; and
         generating, concurrently, a floorplan for both the first and the second dies of the 3D electronic design using at least the wrapper designs for the circuit component designs in the second die design, the first die design, the first technology file, and without using the second technology file.

19. The system of claim 18, wherein generating the wrapper design comprises:
   identifying a block, cell, instance, or macro of the circuit component designs from the second die design;
   identifying a pin in the block, cell, instance, or macro of the circuit component designs;
   identifying a size or boundary of the block, cell, instance, or macro of the circuit component designs;
   creating a model bump for the pin of the block, cell, instance, or macro of the circuit component designs;
   creating a standard bump for a block, cell, instance, or macro of circuit component designs in the second die design of the 3D electronic design; and
   correlating the standard bump for the block, cell, instance, or macro of circuit component designs in the second die design with the model bump for the block, cell, instance, or macro of circuit component designs in the first die design.

20. The system of claim 18, wherein the 3D electronic design comprises a memory-on-logic electronic design, the timing or interface model comprises an interface logic model, a flexible interface logic model, quick time model, or an extracted timing model, and the concurrent implementation of the 3D electronic design is performed for both the first and the second die designs using a single electronic design automation (EDA) tool session.

* * * * *